United States Patent
Jiang et al.

(10) Patent No.: US 8,927,878 B2
(45) Date of Patent: Jan. 6, 2015

(54) PRINTED CIRCUIT BOARD AND ELECTRONIC APPARATUS THEREOF

(71) Applicant: MediaTek Singapore Pte. Ltd., Singapore (SG)

(72) Inventors: Jieyun Jiang, Shenzhen (CN); Shih-Chin Lin, Daxi Township, Taoyuan County (TW); Fu-Kang Pan, New Taipei (TW); Yang Liu, Shenzhen (CN); Hung-Chang Hung, Taipei (TW)

(73) Assignee: MediaTek Singapore Pte. Ltd, Singapore (SG)

( * ) Notice: Subject to any disclaimer, the term of this patent is extended or adjusted under 35 U.S.C. 154(b) by 98 days.

(21) Appl. No.: 13/663,787

(22) Filed: Oct. 30, 2012

(65) Prior Publication Data

US 2013/0107483 A1    May 2, 2013

Related U.S. Application Data

(60) Provisional application No. 61/553,348, filed on Oct. 31, 2011.

(30) Foreign Application Priority Data

Dec. 19, 2011    (CN) .......................... 2011 1 0427812

(51) Int. Cl.
- *H05K 1/11*    (2006.01)
- *H05K 1/18*    (2006.01)
- *H05K 3/34*    (2006.01)

(52) U.S. Cl.
CPC ................. *H05K 1/18* (2013.01); *H05K 1/111* (2013.01); *H05K 3/3452* (2013.01); *H05K 3/3436* (2013.01); *H05K 2201/094* (2013.01)
USPC ............................ 174/261; 361/767; 257/734

(58) Field of Classification Search
CPC ....... H05K 1/18; H05K 1/111; H05K 3/3452; H05K 2201/094; H05K 3/3436
USPC .................. 174/261, 263; 257/734, 773, 775, 257/E23.01, E21.585, 779, 780, 781; 361/767, 736
See application file for complete search history.

(56) References Cited

U.S. PATENT DOCUMENTS

| | | | | |
|---|---|---|---|---|
| 6,787,918 | B1* | 9/2004 | Tsai et al. | 257/778 |
| 7,919,858 | B2* | 4/2011 | Danno | 257/734 |
| 8,232,641 | B2* | 7/2012 | Ozawa et al. | 257/737 |
| 2002/0066948 | A1* | 6/2002 | Kim | 257/678 |
| 2002/0070451 | A1 | 6/2002 | Burnette et al. | |
| 2005/0248037 | A1* | 11/2005 | Hung et al. | 257/778 |
| 2007/0096338 | A1 | 5/2007 | Kim et al. | |

FOREIGN PATENT DOCUMENTS

| | | |
|---|---|---|
| TW | 592387 U | 6/2004 |
| TW | 200915943 A | 4/2009 |

OTHER PUBLICATIONS

Electronic English translation of TW592387 (Published Jun. 11, 2004).
Electronic English translation of TW200915943 (Published Apr. 1, 2009).

* cited by examiner

*Primary Examiner* — Angel R Estrada
*Assistant Examiner* — Dimary Lopez Cruz
(74) *Attorney, Agent, or Firm* — McClure, Qualey & Rodack, LLP

(57) ABSTRACT

Embodiments of a printed circuit board (PCB) and an electronic apparatus are provided. The PCB includes a PCB substrate and a plurality of the pads. The PCB substrate is disposed with the plurality of the pads. The plurality of the pads include a first type of the pads and a second type of the pads. The first type of the pads adopts the solder mask defined structure, and the second type of the pads adopts the non-solder mask defined structure.

16 Claims, 4 Drawing Sheets

PRINTED CIRCUIT BOARD AND ELECTRONIC APPARATUS THEREOF

CROSS REFERENCE TO RELATED APPLICATIONS

This application claims priority of U.S. Provisional Application No. 61/553,348, filed on Oct. 31, 2011 and China Patent Application No. 201110427812.0, filed on Dec. 19, 2011, and the entirety of which is incorporated by reference herein.

BACKGROUND OF THE INVENTION

1. Field of the Invention

The present invention relates to Printed Circuit Board (PCB) technology, and in particular relates to a PCB and an electronic apparatus having two or more types of pad structures.

2. Description of the Related Art

As electronic equipment technology continues to develop, more and more integrated circuit (IC) packages with small space are needed for electronic equipment. A Fine-Pitch Ball Grid Array (FPGA) is one key of fine chip scale package technology.

Presently for FBGA technology, pins of ICs for Printed Circuit Boards (PCBs) typically fully employ Solder Mask Defined (SMD) pad structure or fully employ Non-Solder Mask Defined (NSMD) pad structure. The SMD structure utilizes solder mask to control dimensions of pads. Since the size of the opening of the solder mask is smaller than the dimensions of copper roofing, the solderable pad size is equal to the dimensions of the solder mask opening. As for the NSMD structure, the NSMD structure utilizes copper roofing to control the dimensions of the pads. Since the size of the opening of the solder mask is greater than the dimensions of the copper roofing, the solderable pad size is equal to the dimensions of the copper roofing opening.

Although PCBs which fully adopt the SMD structure for pads can provide better pad size control, the dimensions of the pads have to be increased due to all pads adopting the SMD structure. Thus, the outing line rate for IC layout is decreased, leading to an increase in the dimensions of the PCB and IC, which increases the fabrication costs for the PCBs. On the contrary, when PCBs fully adopt the NSMD structure for pads, the outing line rate for IC layout can be increased. However, IC layout difficulty increases along with design constraints. Further, for power/ground pin pads, routing wires are required to be thick and the number thereof is required to be a large number. In this case, pad size control is made more difficult. Accordingly, the sizes of PCB pads may be different, leading to a decrease in fabrication success rate when utilizing Surface Mounted Technology (referred to as SMT), and increasing solder bridge and short-circuit issues for ICs.

Accordingly, when PCBs fully adopt the SMD structure for pads, the pad out-of-line rate decreases and PCB costs increases. Whereas when PCBs fully adopt the NSMD structure for pads, difficulty in the control of the pad size increases, which leads to increased inconsistencies, leading to solder bridge and short-circuit issues for ICs.

BRIEF SUMMARY OF THE INVENTION

A detailed description is given in the following embodiments with reference to the accompanying drawings.

An embodiment of a printed circuit board (PCB) is described, comprising a PCB substrate and a plurality of the pads. The PCB substrate is disposed with the plurality of the pads. The plurality of the pads comprise a first type of the pads and a second type of the pads. The first type of the pads adopts the solder mask defined structure, and the second type of the pads adopts the non-solder mask defined structure.

Another embodiment of an electronic apparatus is provided, comprising a PCB and an integrated circuit (IC). The IC is soldered on the PCB. The PCB comprises a PCB substrate and a plurality of the pads. The PCB substrate is disposed with the plurality of the pads. The plurality of the pads comprise a first type of the pads and a second type of the pads. The first type of the pads adopts the solder mask defined structure, and the second type of the pads adopts the non-solder mask defined structure.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

For better understanding of the embodiments of the invention, explanations for SMD structures and NSMD structures are provided.

Figure 1A:
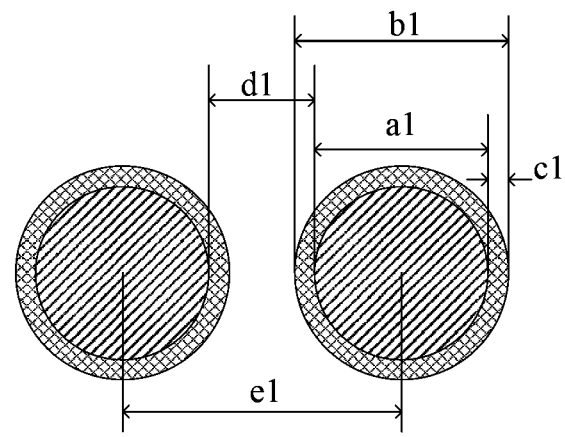
FIG. 1A is a structural diagram of an SMD structure for a pad design according to an embodiment of the invention.
Figure 1B:
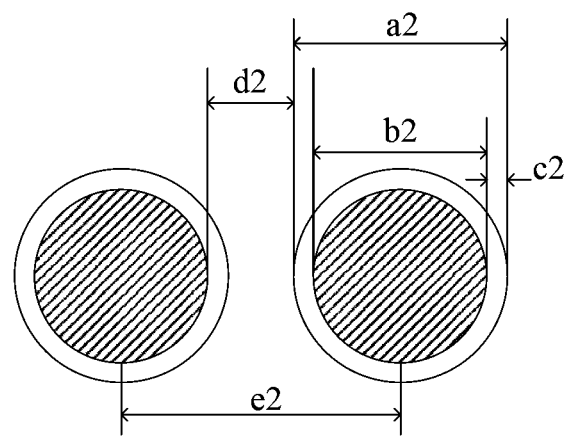
FIG. 1B is a structural diagram of an NSMD structure for a pad design according to an embodiment of the invention.

FIG. 1A is a structural diagram of an SMD structure for a pad design according to an embodiment of the invention, and FIG. 1B is a structural diagram of an NSMD structure for a pad design according to an embodiment of the invention. The pad with the SMD structure adopts the SMD technology. Referring to FIG. 1A, for a pad with the SMD structure, the size of the solder mask opening is $a1$, the size of the PCB pad is $b1$, the size of the solder mask on the pad is $c1$, the size of the solder dam is $d1$, and the pin pitch between adjacent pads is $e1$. Thus, the solderable dimensions for the pad with the SMD structure depends on the size of the solder mask opening $a1$. The pad with the NSMD structure adopts the NSMD technology. Referring to FIG. 1B, for a pad with the SMD structure, the size of the solder mask opening is $a2$, the size of the PCB pad is $b2$, a solder mask clearance between the solder mask and the copper roof of the pad is $c1$, the size of the solder dam is $d2$, and the pin pitch between any two adjacent pads is $e2$. Therefore, the solderable dimensions for the pad with the NSMD structure depends on the size of the PCB pad, or $b2$.

Due to the pad with SMD structure employing the solder mask for controlling the pad size, which is determined by the size of the solder mask opening $a1$ in the case of the SMD technology, and the size of the solder mask opening a1 being less than the copper roof size, the solderable pad dimensions is equal to the size of the solder mask opening a1. The following embodiment takes a BGA packaged IC with a 0.4 ball pitch as an example for explanation. As shown in FIG. 1A, when processing the pins and pads by the SMD technology, and the solderable pad dimensions is 0.25 mm, the size of the solder mask opening a1 has to be 0.25 mm accordingly. However in practice, the pad size on the PCB exceeds 0.25 mm. As illustrated in FIG. 1A, the practical pad size b1 on the PCB is 0.325 mm. Whereas for NSMD technology, since the dimensions of the solderable pad is controlled by the copper roof, and the size of the solder mask opening exceeds the size of the copper roof, the size for the solderable pad is equal to the size for the copper roof. As depicted in FIG. 1B, when adopting the NSMD technology for processing the pads and the pins, and the required solderable pad size is also 0.25 mm, the copper roof size on pad b2 can be 0.25 mm. Consequently, the practical pad size b2 can also be 0.25 mm.

Figure 1C:
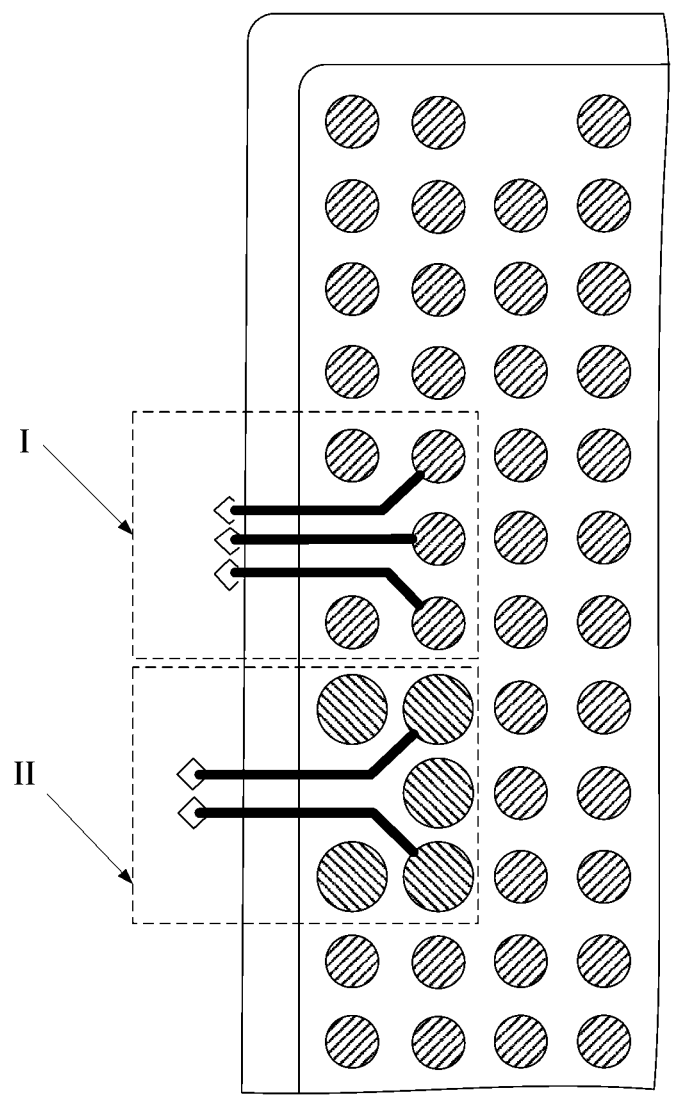
FIG. 1C is a structural diagram illustrating the contrast between a pad with the SMD structure and a pad with the NSMD structure according to an embodiment of the invention.

FIG. 1C is a structural diagram illustrating the contrast between a pad with the SMD structure and a pad with the NSMD structure according to an embodiment of the invention. As shown in FIG. 1C, the PCB is designed for an IC package with a 0.4 ball pitch (distances between centers of adjacent balls are 0.4 mm), wherein pads in the field I adopt the NSMD structure, pads in the field II adopt the SMD structure. It can be seen from FIG. 1C, for the IC package with a 0.4 ball pitch, when adopting the SMD structure, the pad has a increased size which is easy to control, but the space between two adjacent pads is reduced, allowing for a reduced number of routing wires passing through the reduced space, and rendering a reduced outing line rate. When adopting the NSMD structure pads, the pad has a reduced pad size, therefore, the pad size is less controllable, having an increased space between two adjacent pads, allowing for an increased number of routing wires passing through the increased space, and increasing the outing line rate.

On the PCB of the embodiment, the pads with less controllable pad sizes may be configured by the SMD structure, the pads with more controllable pad sizes, while a preferred increased outing line rate may be configured by the NSMD structure. Specifically, the PCB may include a PCB substrate in the embodiment, and the PCB substrate may include a plurality of the pads containing a first type of the pads and a second type of the pads. The first type of the pads can adopt the SMD structure in FIG. 1A, the second type of the pads can adopt the NSMD structure in FIG. 1B. As such, by adopting the SMD structure only for a part of the pads on the PCB, the consistency of the pad sizes may be increased, and by adopting the SMD structure for the part of the pads and the NSMD structure for another part of the pads, particularly, for pads corresponding to the same component or device, outing line rate may be increased.

Further explanations are provided for other embodiments of the invention.

Figure 2:
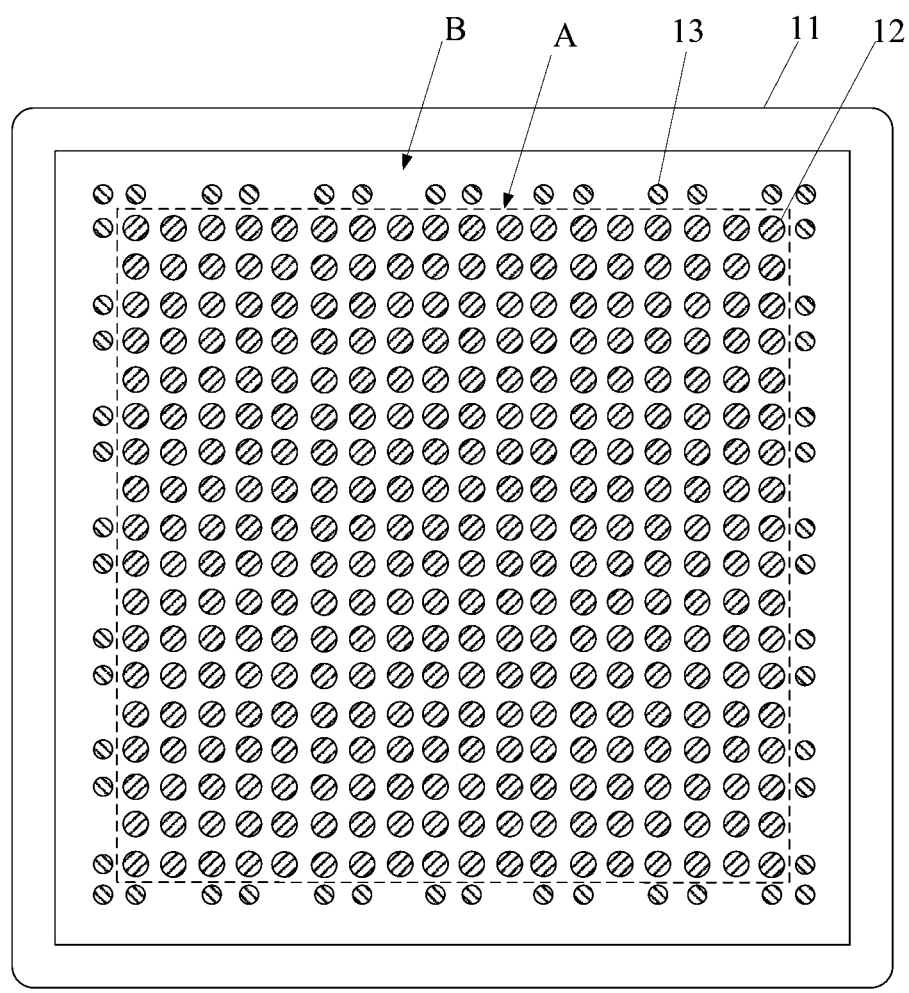
FIG. 2 is a structural diagram of a printed circuit board according to an embodiment of the invention.

FIG. 2 is a structural diagram of a printed circuit board according to an embodiment of the invention. Either the SMD structure or the NSMD structure can be assigned in the embodiment. For example, adopting the SMD structure for the pads on certain fields of the PCB, while adopting the NSMD structures for the pads on another field of the PCB, will lead to two types of the pad fields on the PCB. Specifically, as depicted in FIG. 2, the PCB in the embodiment includes a PCB substrate 11 disposed with a plurality of the pads, wherein the pads placed on a central field A of the PCB substrate 11 belong to a first type of the pads 12, i.e., the pads with the SMD structure, and the pads placed on an external field B of the PCB substrate 11 belong to a second type of the pads 13, i.e., the pads with the NSMD structure. The external field B is external to the area outside of the central area A on the PCB.

In the embodiment, the pads on the central field A corresponds to the pins beneath of the ICs soldered on the PCB. The pad sizes on the central field A require high consistency, leading to less controllable pad sizes. By adopting the SMD structure for the pads, the solderable pad sizes are controllable by the solder mask when the pads are formed, thereby effectively controlling the pad sizes in the central field A, increasing the consistency of the pad sizes, and reducing the problem of the solder bridge when soldering the ICs onto the PCB. Concurrently, the pads, corresponding to the pins of the ICs, requiring the copper roofs to be less than or equal to the pad sizes, can adopt the NSMD structure. The NSMD structure can control the pad sizes by the copper roof, raising the outing line rate for the pads within the external field B through the uses of the solder mask, effectively preventing the copper roof from being excessively expended, thereby increasing the electrical performance of the PCB.

In the embodiment, the pads on the external field B have fewer pad size requirements. Consequently, the pad sizes are easily controlled, providing increased outing line rates. The external field B adopts the NSMD structure for the pads. When the pads are being fabricated, by utilizing the copper roof for controlling the pad sizes, the outing line rate for the pads within the external field B can be effectively increased, effectively meeting the increased outing line rate for the ICs, thereby increasing the space utilization rate of the PCB and decreasing fabrication costs for the PCB.

In practice, during the layout procedure for the pads of the PCB, when the pads placed in the central field A, corresponding to the pins under the IC, are routed by thick wires and an increased number of wires, and the pad sizes thereof are inconsistent. Thus, the solder bridge condition may be induced, leading to short-circuit problems on the PCB. However, when the pads are being fabricated, the pad size can be controlled by the SMD structure and the solder mask to ensure the consistency of the pad sizes, preventing the occurrence of the solder bridge during soldering of the ICs onto the PCB. The pads in the external field B can adopt the NSMD structure to increase the outing line rate thereof, due to the increased controllability over the pad sizes, controlling the pad sizes through the copper roof when the pads are being fabricated, thereby increasing the space utilization rate of the PCB and decreasing fabrication costs for the PCB.

For examples, in the embodiment, when soldering the ICs with a 0.4 ball pitch onto the PCB, the pads on the PCB can configure the solderable pad sizes to be in a range from 0.21 mm to 0.26 mm to meet the requirements for the ICs with a 0.4 ball pitch on the PCB. Therefore, the pads adopting the SMD structure may adopt the solder mask opening of the range from 0.21 mm to 0.26 mm. In practice, the practical pad sizes on the PCB range from 0.28 mm to 0.33 mm. For the pads adopting the NSMD structure, the adoptable size of the solder mask openings are from 0.28 mm to 0.33 mm, while the practical pad sizes on the PCB range from 0.21 mm to 0.26 mm. Thus, the solderable fields for all pads on the PCB for the same IC may be kept consistent, ensuring the solder result for the IC and the performance for the soldered IC.

In the embodiment, as depicted in FIG. 2, the pads in the central field A and the external field B correspond to an IC package, or, the pads corresponding to the same IC are concurrently disposed with the pads adopting the SMD structure and the pads adopting the NSMD structure. Further, for the pads corresponding to the same IC, the pads at the central field adopt the SMD structure, and the pads at the external field adopt the NSMD structure.

Those with ordinary skill in the art may appreciate that, when multiple components are on the same printed circuit board, the pads corresponding to each component can adopt the SMD structure for a part of the pads, while adopting the NSMD structure for another part of the pads, alternatively, such that the pads corresponding to a part of the components can fully adopt the SMD structure, while the pads corresponding to the other part of the components can fully adopt the NSMD structure. In a preferred embodiment, the component package for any given component can also adopt a design for the mixed SMD and NSMD structures, corresponding to the pad design for the mixed SMD and NSMD structures.

In the embodiment, in contrast to a PCB fully adopting the SMD structure for the pads, by using the NSMD structure for a part of the pads, the outing line rate and the space utilization rate for the PBC layout can be increased, thereby reducing the stack-up layers of the PCB. For example, the PCB fully adopting the SMD structure for the pads requires a PCB structure of (2+N+2) stack-up layers. By utilizing the NSMD structure for a part of the pads, the number of the stack-up layers can be decreased to (1+N+1) stack-up layers. In another example, the PCB fully adopting the SMD structure for the pads requires a 10-layer structure. By utilizing the NSMD structure for a part of the pads, the number of the stack-up layers on the PCB can be reduced to 8 layers. Moreover, the embodiments not only reduce the number of the stack-up layers on the PCB, but also retain the consistency of the pad size for less controllable pads by adopting the SMD structure, preventing the IC from solder bridge issues or false soldering issues due to uneven distribution of lead during the mounting process. The less controllable pads may be, for examples, the pads connecting to the increased number or increased width of routing wires, or the pads corresponding to the ground pin or the power pin.

In the embodiments, by adopting the SMD structure for the pads at the central field of the PCB substrate, the pad sizes can be kept consistent, thereby reducing the solder bridge issues or the false soldering issues in the SMT process, and preventing the occurrence of the short circuit or circuit disconnection during the soldering process for the IC. Concurrently, by adopting the NSMD structure for the pads at the external field of the PCB substrate, the outing line rate directing signals out from the IC can be increased, thereby increasing the space utilization rate for the PCB layout, reducing the stack-up structure for the PCB, and decreasing the costs for the PCB.

Figure 3:
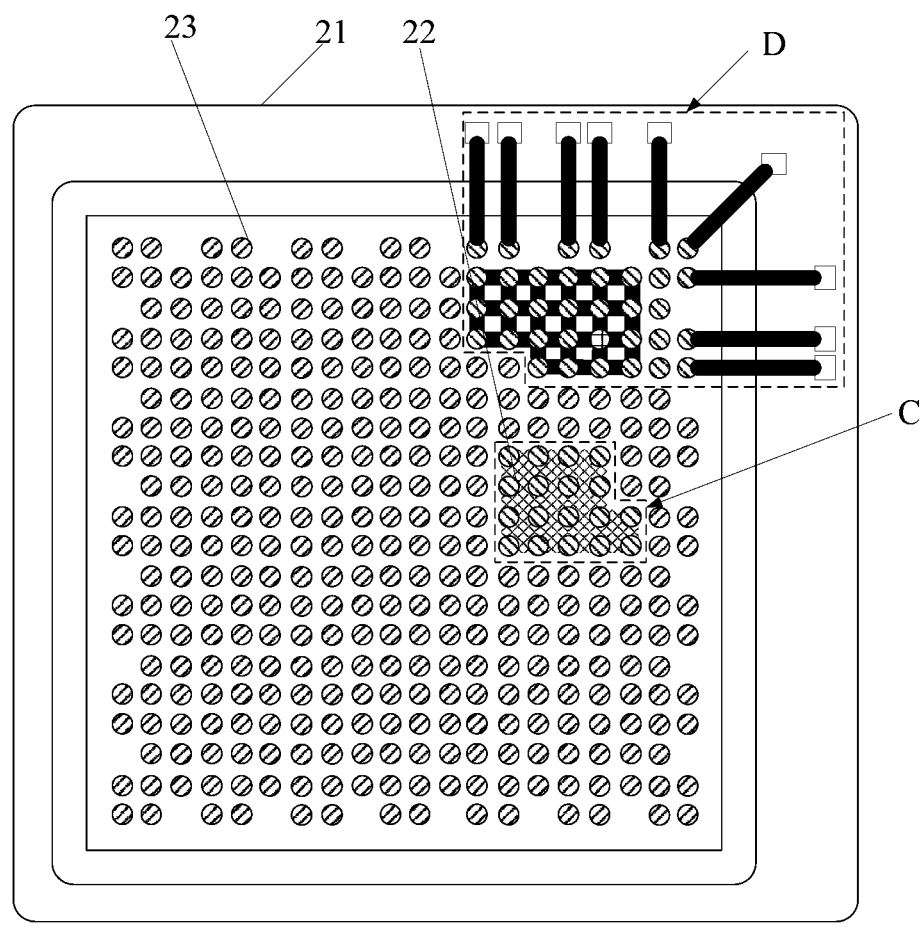
FIG. 3 is a structural diagram of a printed circuit board according to the other embodiment of the invention.

FIG. 3 is a structural diagram of a printed circuit board according to the other embodiment of the invention. The embodiment in FIG. 3 is different from that in FIG. 2 in that the choice of the pads utilizing the SMD structure or the NSMD structure may be based on the functionalities of the pins corresponding to the pads. The pads corresponding to the pins with a certain type of functionalities can adopt the SMD structure, while pads corresponding to the pins with another type of functionalities can adopt the NSMD structure, thereby forming two types of the pads. For example, the pads requiring thicker routing wires, an increased number of routing wires, or routing wires covered by copper roofs can adopt the SMD structure, while the pads requiring increased outing line rate and/or increased controllability over the consistency of the pad sizes can adopt the NSMD structure. Specifically, as depicted in FIG. 3, the PCB 21 in the embodiment is disposed with a number of the pads. The pads in the field C and field D are the pads 22 that adopt the SMD structure, and the pads in the fields on the PCB substrate other than the field C and field D are the pads 23 that adopt the NSMD structure.

In the embodiments, as shown in FIG. 3, the fields C and D contain pads with less controllable pad sizes, since the pads in the field C require thicker routing wires and an increased number of the routing wires, and the pads in the field D require the routing wires to be covered by copper roofs. By using the pads adopting the SMD structure, the consistency of the pad sizes can be increased, preventing the pads from being distorted. In practice, the pads requiring thicker routing wires and/or the increased number of the routing wires may connect to the ground pins, the power pins, or other pins which require an increased connection area.

In the embodiments, the pads on the fields other than the fields C and D, having more controllable pad sizes, can adopt the NSMD structure, increasing the outing line rate, thereby increasing the space utilization rate for the PCB layout, reducing the stack-up structure for the PCB, and decreasing the dimensions and the cost for the PCB.

In the embodiments, as illustrated in FIG. 3, the pads in the fields C and D may correspond to one IC package. That is, the pads corresponding to the same component can contain the pads adopting the SMD structure and the NSMD structure concurrently. Further, the pads corresponding to the same component can adopt the SMD structure and the NSMD structure according to the functionalities of the pads.

In the embodiments, reference to the preceding paragraphs corresponding to FIG. 2, may be made for explanations for the pad sizes on the PCB, adopted by the SMD structure and the NSMD structure. Thus, explanations are not repeated again for brevity.

Those with ordinary skill in the art may appreciate that, the pad design for the PCB corresponds to the pins of the IC package, configuring the pads by the SMD structure or the NSMD structure to meet the requirements of the IC package. In practice, the pads may be configured into the pad type for the SMD structure and the pad type for the NSMD structure based on the design requirement of the IC, and the wiring of the pins on the IC, ensuring no solder bridge issue occurs when soldering the IC onto the PCB, while reducing the number of layers on the PCB, and decreasing the cost of the PCB.

Those with ordinary skill in the art may appreciate that other than assigning the pad types only by the locations as shown in FIG. 2, and assigning the pad types only by the functions as shown in FIG. 3, the pad types on the PCB may be assigned the based on both the locations and the functions to meet the requirement. In other words, on a printed circuit board, parts of the pads can be assigned based on the locations of the pads, parts of the pads can be assigned based on the functions of the pins corresponding to the pads. In practice, the invention is not limited by the embodiments provided in the specification, the pads may be assigned based on the realistic circuit requirements to define the pads types on the PCB, so long as the pad assignment for the PCB conforms to the principle of the invention.

Those having ordinary skill in the art may appreciate that the embodiments of the invention are not only limited to PCBs for ICs with the BGA package, but also applicable for other types of IC packages or other package sizes. For example, the other applicable types of IC packages may be a Chip Scale Package (CSP), a Quad Flat No-lead Package (QFN), and so on. The invention is not limited to the IC with a 0.4 ball pitch BGA package in the embodiments.

Further, an electronic apparatus according to an embodiment of the invention is also provided. The electronic apparatus includes a PCB and an IC soldered thereon. The PCB adopts various embodiments which are described in the specification, and reference can be found in the preceding paragraphs. Thus, explanations are not repeated again for brevity.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A printed circuit board (PCB), comprising:
a PCB substrate; and
a plurality of the pads, disposed on the PCB substrate, comprising a first type of the pads and a second type of the pads,
wherein the first type of the pads adopts solder mask defined structure, the second type of the pads adopts non-solder mask defined structure, the first type of the pads require thicker routing wires or increased number of routing wires than what the second type of the pads require, and the second type of the pads require increased outing line rate and/or increased controllability over the consistency of pad size than what the first type of the pads require.

2. The printed circuit board of claim 1, wherein the first type and the second type of the pads correspond to a same component on the PCB substrate.

3. The printed circuit board of claim 2, wherein the plurality of the pads correspond to the same component, and the first type of the pads is located at a central field of the plurality of pads, and the second type of the pads is located at an external field of the plurality of the pads.

4. The printed circuit board of claim 1, wherein the first type of the pads corresponds to pins having a copper roof.

5. The printed circuit board of claim 1, wherein the first type of the pads corresponds to a power trace or a ground trace on the PCB.

6. The printed circuit board of claim 1, wherein the first type of the pads is applied to pins which require a connection size which exceeds those of the second type of the pads.

7. The printed circuit board of claim 1, wherein when a solderable pad size on the PCB for a component ranges from 0.21 mm to 0.26 mm, then the size of the solder mask opening for the first type of the pads corresponding to the component ranges from 0.21 mm to 0.26 mm, and a practical pad size for the first type of the pads ranges from 028 mm to 0.33 mm.

8. The printed circuit board of claim 7, wherein the size of the solder mask opening for the second type of the pads corresponding to the component ranges from 0.28 mm to 0.33 mm, and a practical pad size for the second type of the pads ranges from 021 mm to 0.26 mm.

9. An electronic apparatus, comprising:
a PCB; and
an integrated circuit (IC), soldered on the PCB,
wherein the PCB comprising:
a PCB substrate; and
a plurality of the pads, disposed on the PCB substrate, comprising a first type of the pads and a second type of the pads,
wherein the first type of the pads adopts solder mask defined structure, the second type of the pads adopts non-solder mask defined structure, the first type of the pads require thicker routing wires or increased number of routing wires than what the second type of the pads require, and the second type of the pads require increased outing line rate and/or increased controllability over the consistency of pad size than what the first type of the pads require.

10. The electronic apparatus of claim 9, wherein the first type and the second type of the pads correspond to a same component on the PCB substrate.

11. The electronic apparatus of claim 10, wherein the plurality of the pads correspond to the same component, and the first type of the pads is located at a central field of the plurality of pads, and the second type of the pads is located at an external field of the plurality of the pads.

12. The electronic apparatus of claim 9, wherein the first type of the pads corresponds to pins having a copper roof.

13. The electronic apparatus of claim 9, wherein the first type of the pads corresponds to a power trace or a ground trace on the PCB.

14. The electronic apparatus of claim 9, wherein the first type of the pads is applied to pins which require a connection size which exceeds those of the second type of the pads.

15. The electronic apparatus of claim 9, wherein when a solderable pad size on the PCB for a component ranges from 0.21 mm to 0.26 mm, then the size of the solder mask opening for the first type of the pads corresponding to the component ranges from 0.21 mm to 0.26 mm, and a practical pad size for the first type of the pads ranges from 028 mm to 0.33 mm.

16. The electronic apparatus of claim 15, wherein the size of the solder mask opening for the second type of the pads corresponding to the component ranges from 0.28 mm to 0.33 mm, and a practical pad size for the second type of the pads ranges from 021 mm to 0.26 mm.

* * * * *